(12) United States Patent
Udayakumar et al.

(10) Patent No.: US 6,984,857 B2
(45) Date of Patent: Jan. 10, 2006

(54) HYDROGEN BARRIER FOR PROTECTING FERROELECTRIC CAPACITORS IN A SEMICONDUCTOR DEVICE AND METHODS FOR FABRICATING THE SAME

(75) Inventors: K. R. Udayakumar, Dallas, TX (US); Martin G. Albrecht, McKinney, TX (US); Theodore S. Moise, IV, Dallas, TX (US); Scott R. Summerfelt, Garland, TX (US); Sanjeev Aggarwal, Plano, TX (US); Jeff L. Large, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/620,516

(22) Filed: Jul. 16, 2003

(65) Prior Publication Data

US 2005/0012126 A1 Jan. 20, 2005

(51) Int. Cl.
*H01L 29/76* (2006.01)

(52) U.S. Cl. ...................... 257/295; 257/310; 438/253; 438/396

(58) Field of Classification Search ................. 438/253, 438/396; 257/295, 310
See application file for complete search history.

(56) References Cited

U.S. PATENT DOCUMENTS

| | | | |
|---|---|---|---|
| 5,452,178 A | | 9/1995 | Emesh et al. |
| 5,825,068 A | * | 10/1998 | Yang ........................... 257/380 |
| 5,972,722 A | | 10/1999 | Visokay et al. |
| 6,090,697 A | | 7/2000 | Xing et al. |

(Continued)

OTHER PUBLICATIONS

Notes taken at the International Symposium on Applications of Ferroelectrics Conference in Nara, Japan in May, 2002. The speaker was H. Nagel of Infineon Technologies and Toshiba Corporation, Key Technologies for High Density FeRAM Application, one page.

"Comparison Between HCP CVD and PECVD Silicon Nitride for Advanced Interconnect Applications", J. Yota, M. Janani, L.E. Camilletti, A. Kar–Roy, Q.Z. Liu, C. Nguyen, M.D. Woo J. Hander, and P. Van Cleemput, IEEE, 2000, pp. 76–78.

"Hydrogen Role on the Properties of Amorphous Silicon Nitride", F. De Brito Mots, J.F. Justo and A. Fazzio, Journal of Applied Physics, vol. 86, No. 4, Aug. 15, 1999, pp. 1843–1847.

"FeRAM Tutorial", Ali Sheikholeslami and P. Glenn Gulak, A survey of circuit Innovations in Ferroelectric random–access memories, Proceedings of the IEEE, vol. 88, No. 3, May, 2000, 3 pages, taken from the Internet at: http://www.eecg.toronto.edu/–ali/ferro/tutorial.html.

"A survey of Circuit Innovations in Ferroelectric Random Access Memories", Ali Sheikholeslami and P. Glenn Gulak, Proceedings of the IEEE, vol. 88, No. 5, May, 2000, pp. 667–689.

(Continued)

*Primary Examiner*—Sara Crane
(74) *Attorney, Agent, or Firm*—Jacqueline J. Garner; W. James Brady, III; Frederick J. Telecky, Jr.

(57) ABSTRACT

Semiconductor devices and fabrication methods are presented, in which a hydrogen barrier is provided above a ferroelectric capacitor to prevent degradation of the ferroelectric material during back-end manufacturing processes employing hydrogen. The hydrogen barrier comprises silicon rich silicon oxide or amorphous silicon, which can be used in combination with an aluminum oxide layer to inhibit diffusion of process-related hydrogen into the ferroelectric capacitor layer.

26 Claims, 13 Drawing Sheets

U.S. PATENT DOCUMENTS

| | | |
|---|---|---|
| 6,144,060 A | 11/2000 | Park et al. |
| 6,177,351 B1 | 1/2001 | Beratan et al. |
| 6,225,656 B1 | 5/2001 | Cuchiaro et al. |
| 6,242,299 B1 | 6/2001 | Hickert |
| 6,249,014 B1 | 6/2001 | Bailey |
| 6,261,967 B1 | 7/2001 | Athavale et al. |
| 6,291,251 B1 | 9/2001 | Nam |
| 6,423,592 B1 | 7/2002 | Sun |
| 6,495,413 B2 | 12/2002 | Sun et al. |
| 6,528,386 B1 | 3/2003 | Summerfelt et al. |
| 6,534,809 B2 | 3/2003 | Moise et al. |
| 6,576,482 B1 | 6/2003 | Aggarwal et al. |
| 6,611,014 B1 | 8/2003 | Kanaya et al. |
| 6,642,100 B2 * | 11/2003 | Yang et al. .................. 438/253 |
| 6,706,540 B2 * | 3/2004 | Hikosaka et al. ............... 438/3 |
| 6,781,184 B2 * | 8/2004 | Solayappan et al. ......... 257/310 |
| 2001/0034106 A1 | 10/2001 | Moise et al. |
| 2001/0044205 A1 | 11/2001 | Gilbert et al. |
| 2002/0011616 A1 | 1/2002 | Inoue et al. |
| 2002/0016012 A1 | 2/2002 | Kronke et al. |

OTHER PUBLICATIONS

"Generic CVD Reactor", CVD Basics, Daniel M. Dobkin, Dec. 7, 2001, 3 pages, taken from the Internet at: http://www.batn_t.com/_nigmatics/semiconductor_processing/CVD_Fundamentals/introdu . . . .

"Physical Vapor Deposition", Cougar Labs, Inc., Dec. 7, 2001, 9 pages, taken from the Internet at: http://www.cougarlabs.com/pvd1.html.

"The Hydrogen Content of Plasma–Deposited silicon Nitrid", W. A. Lanford and M. J. Rand, American Institute of Physics J. Appl. Phys. 49(4), Apr., 1978, pp. 2473–2477.

"Free Energy Model for the Analysis of Bonding in α–$Si_x$–$N_yH_z$ Alloys", Z. Yin and W. Smith, J. Vac. Sci. Technol. A. vol. 9, No. 3, MayJun., 1991, p. 972.

* cited by examiner

HYDROGEN BARRIER FOR PROTECTING FERROELECTRIC CAPACITORS IN A SEMICONDUCTOR DEVICE AND METHODS FOR FABRICATING THE SAME

FIELD OF INVENTION

The present invention relates generally to semiconductor devices and more particularly to hydrogen barriers for protecting ferroelectric capacitors in a semiconductor device.

BACKGROUND OF THE INVENTION

Memory is used for storage of data, program code, and/or other information in many electronic products, such as personal computer systems, embedded processor-based systems, video image processing circuits, portable phones, and the like. Memory cells may be provided in the form of a dedicated memory integrated circuit (IC) or may be embedded (included) within a processor or other IC as on-chip memory. Ferroelectric memory, sometimes referred to as "FRAM" or "FERAM", is a non-volatile form of memory commonly organized in single-transistor, single-capacitor (1T/1C) or two-transistor, two-capacitor (2T/2C) configurations, in which each memory cell includes one or more access transistors. The non-volatility of an FERAM is due to the bi-stable characteristic of the ferroelectric material in the cell capacitor(s). The cells are typically organized in an array, such as folded-bitline, open-bitline, etc., wherein the individual cells are selected by plateline and wordline signals from address decoder circuitry, with the data being read from or written to the cells along bitlines using sense amp circuits.

FIG. 1 illustrates a 1T/1C FERAM cell 10 including a transistor 12 and a ferroelectric cell capacitor 14. A bottom electrode of the cell capacitor 14 is connected to a first source/drain terminal 15 of the transistor 12 and the other capacitor electrode is coupled to a plateline or driveline 20. Data is read from the cell 10 by applying a signal to the gate 16 of the transistor 12 along a corresponding wordline WL, thereby connecting the bottom electrode of the ferroelectric capacitor 14 to the other transistor source/drain at a bitline 18. A pulse signal is applied to the plateline 20, where the potential on the bitline 18 is the capacitor charge divided by the bitline capacitance. The capacitor charge is dependent upon the pre-existing bi-stable polarization state of the ferroelectric material in the capacitor 14, wherein the bitline potential can have two distinct values. A sense amplifier (not shown) is connected to the bitline 18 to detect the voltage associated with a logic value of either 1 or 0. Because such a read operation is destructive, the cell data is then rewritten back to the memory cell 10.

FIG. 2 illustrates a 2T/2C memory cell 30 in a memory array coupled to a complementary pair of bitlines 32 and 34, where the cell 30 comprises cell transistors 36 and 38 and ferroelectric cell capacitors 40 and 42. The first transistor 36 couples the bitline 32 with a first ferroelectric capacitor 40, and the second transistor 38 couples the complementary bitline 34 to a second ferroelectric capacitor 42. The first and second capacitors 40 and 42 have a common plateline 44 to which a signal is applied for polarizing the capacitors 40 and 42 during read and write operations. For a write operation, the transistors 36 and 38 are enabled via a wordline 46 to couple the capacitors 40 and 42 to the complementary logic levels on the bitlines 32 and 34 corresponding to a logic state to be stored in the cell 30. The plateline 44 is pulsed to polarize the capacitors 40, 42 to correspond to the desired logic state. In a read operation, the transistors 36 and 38 are enabled via the wordline 46 to couple the information stored in the ferroelectric capacitors 40 and 42 to the complementary bitline pair 32 and 34, and a pulse is applied to the plateline 44. This provides a differential signal across the bitline pair 32 and 34 that is sensed by a sense amplifier (not shown), wherein the sensed signal has a polarity corresponding to the data read from the cell 30.

Ferroelectric memory cells are often fabricated in stand-alone memory integrated circuits (ICs) and/or in logic circuits having on-board non-volatile memory (e.g., microprocessors, DSPs, communications chips, etc.). The ferroelectric memory arrays are typically constructed in a device wafer along with CMOS logic circuits, wherein the cell transistors are formed concurrently with logic transistors in the device, and the ferroelectric capacitors are constructed in a capacitor layer above the wafer substrate. For example, the construction of the ferroelectric cell capacitors may be integrated into a CMOS fabrication process flow after transistor formation (e.g., after 'front-end' processing), and before the metalization or interconnection processing (e.g., before 'back-end' processing). However, many back-end processing steps include hydrogen, for example, in forming trench etch-stop layers, etch clean operations, copper sintering, and other process steps. This process hydrogen diffuses into the ferroelectric cell capacitors, causing degradation in the electric properties of the ferroelectric memory cells, including degraded switched polarization. Consequently, there is a need for hydrogen barriers and fabrication processes for protecting ferroelectric capacitors from hydrogen in back-end processing.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope of the invention. Rather, the primary purpose of the summary is to present one or more concepts of the invention in a simplified form as a prelude to the more detailed description that is presented later. The invention relates to ferroelectric memory devices and fabrication methods therefor, in which hydrogen barriers are formed over ferroelectric capacitors to prevent or inhibit memory cell degradation due to hydrogen from back-end processing.

One aspect of the invention provides methods for fabricating a semiconductor device, that include forming a ferroelectric capacitor in a capacitor layer above a semiconductor body, and forming a hydrogen barrier above the ferroelectric capacitor, wherein the hydrogen barrier comprises silicon rich silicon oxide (referred to herein as SILOX) or amorphous silicon. The hydrogen barrier may be a multi-layer structure, wherein one or more layers are fabricated using a silicon rich silicon oxide (SILOX) and/or amorphous silicon material. The inventors have appreciated that SILOX and/or amorphous silicon situated above or directly over the ferroelectric capacitor structures operates as an effective barrier to the diffusion of hydrogen. The SILOX or amorphous silicon may be used alone or may be formed over a first barrier layer, such as aluminum oxide (AlOx) or other material that does not react with a ferroelectric material.

In certain implementations illustrated and described below, a bi-layer barrier of AlOx/SILOX can be used, with a silicon nitride (SiN) or other etch-stop layer being formed over the hydrogen barrier for subsequently forming bitline and ferroelectric capacitor contacts or vias into the capacitor layer. In another example, a four-layer barrier stack includes AlOx or other non-reactive material formed over the ferroelectric capacitors, a first SILOX layer formed over the AlOx, an amorphous silicon layer formed over the first SILOX layer, and a second SILOX layer formed over the amorphous silicon. A SiN or other etch-stop material, and an inter-layer or inter-level dielectric (ILD) may then be formed over the hydrogen barrier prior to fabrication of other back-end metalization layers or levels. In another implementation, a bi-layer hydrogen barrier is formed over the ferroelectric capacitors, for example, including an AlOx overlying the ferroelectric capacitors, with an etch-stop layer over the AlOx, and a SILOX inter-level dielectric (ILD) formed above the etch-stop layer.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
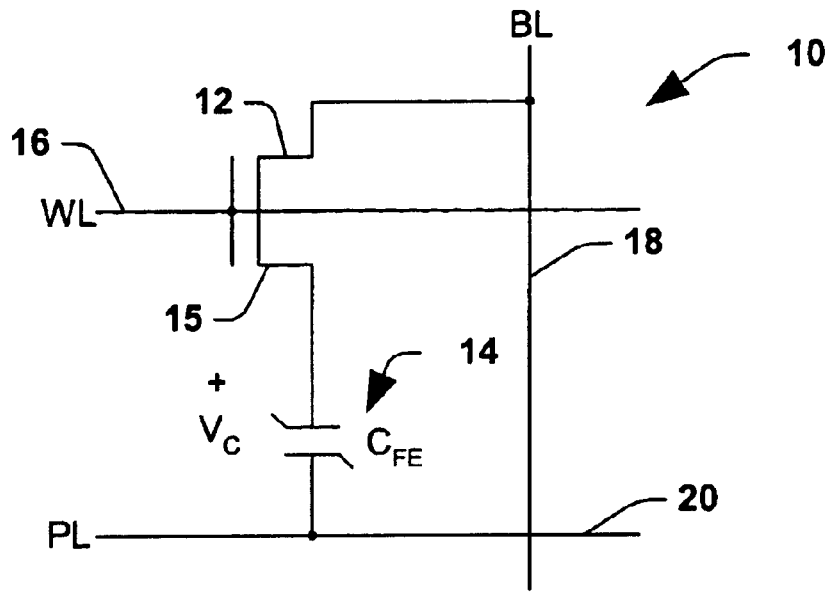
FIG. 1 is a schematic diagram illustrating an exemplary 1T/1C FERAM memory cell.
Figure 2:
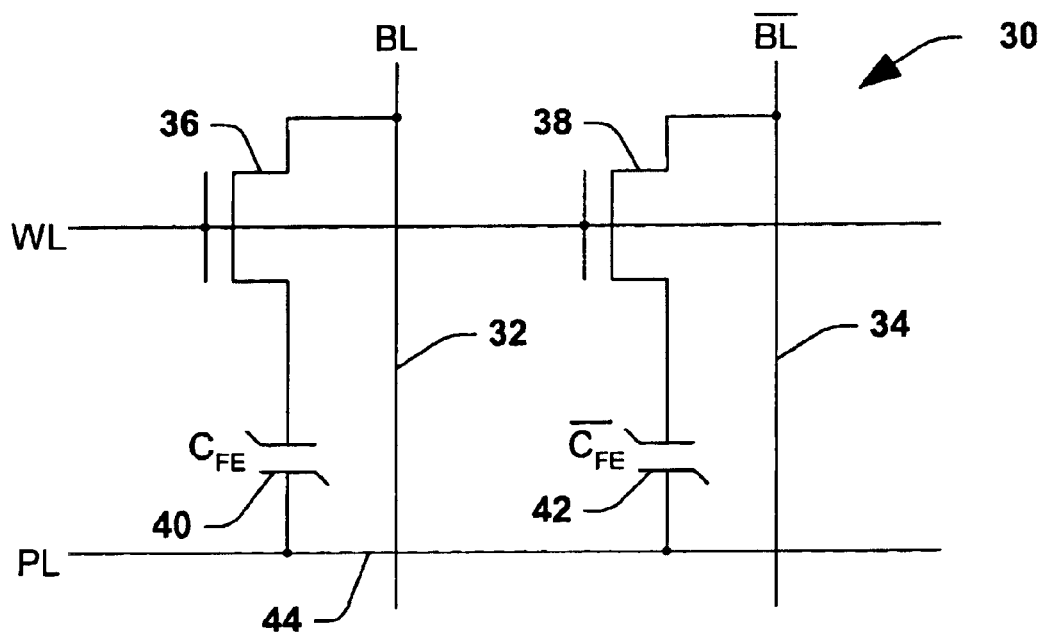
FIG. 2 is a schematic diagram illustrating an exemplary 2T/2C FERAM memory cell.

The present invention will now be described with reference to the attached drawing figures, wherein like reference numerals are used to refer to like elements throughout.

The invention relates to semiconductor devices and fabrication methods in which a hydrogen barrier is formed above ferroelectric capacitors using silicon rich silicon oxide (SILOX) and/or amorphous silicon to prevent or mitigate degradation of the capacitor ferroelectric materials. The inventors have appreciated that ferroelectric films may be severely degraded by exposure to hydrogen in back-end processing found in many CMOS integration schemes. The invention provides hydrogen barriers allowing integration of ferroelectric cell capacitor fabrication in conjunction with existing back-end interconnect (e.g., metalization) processing, while reducing or mitigating hydrogen-related ferroelectric degradation in stand-alone memory products or devices having embedded ferroelectric memory.

While the following examples illustrate exemplary ferroelectric capacitors formed using PZT materials, the invention may be employed in association with ferroelectric capacitors fabricated with any ferroelectric materials. Moreover, although the following examples illustrate 1T/1C ferroelectric memory cells having a single transistor and a single ferroelectric capacitor in an open-bitline array, the invention may be employed in other cell types and array architectures including but not limited to 1T-1C, 2T-2C, or other cell types in folded-bitline, open-bitline, chain-FRAM, or other array configurations. In addition, the exemplary semiconductor devices are illustrated herein with ferroelectric capacitors formed in a dielectric layer or level after front-end contact formation and prior to formation of overlying interconnect levels or layers (back-end). However, the various aspects of the invention may be employed at other points in a fabrication process, for example, wherein the ferroelectric capacitors are formed at any level in a multilevel semiconductor device design, with hydrogen barriers formed over or above the ferroelectric capacitors. Furthermore, the invention may be employed in semiconductor devices fabricated on or in any type of semiconductor body, including but not limited to silicon substrates or SOI wafers. In this regard, the invention is not limited to the examples illustrated and described herein, and all variant implementations providing overlying hydrogen barriers using SILOX or amorphous silicon are contemplated as falling within the scope of the present invention and the appended claims.

Figure 3:
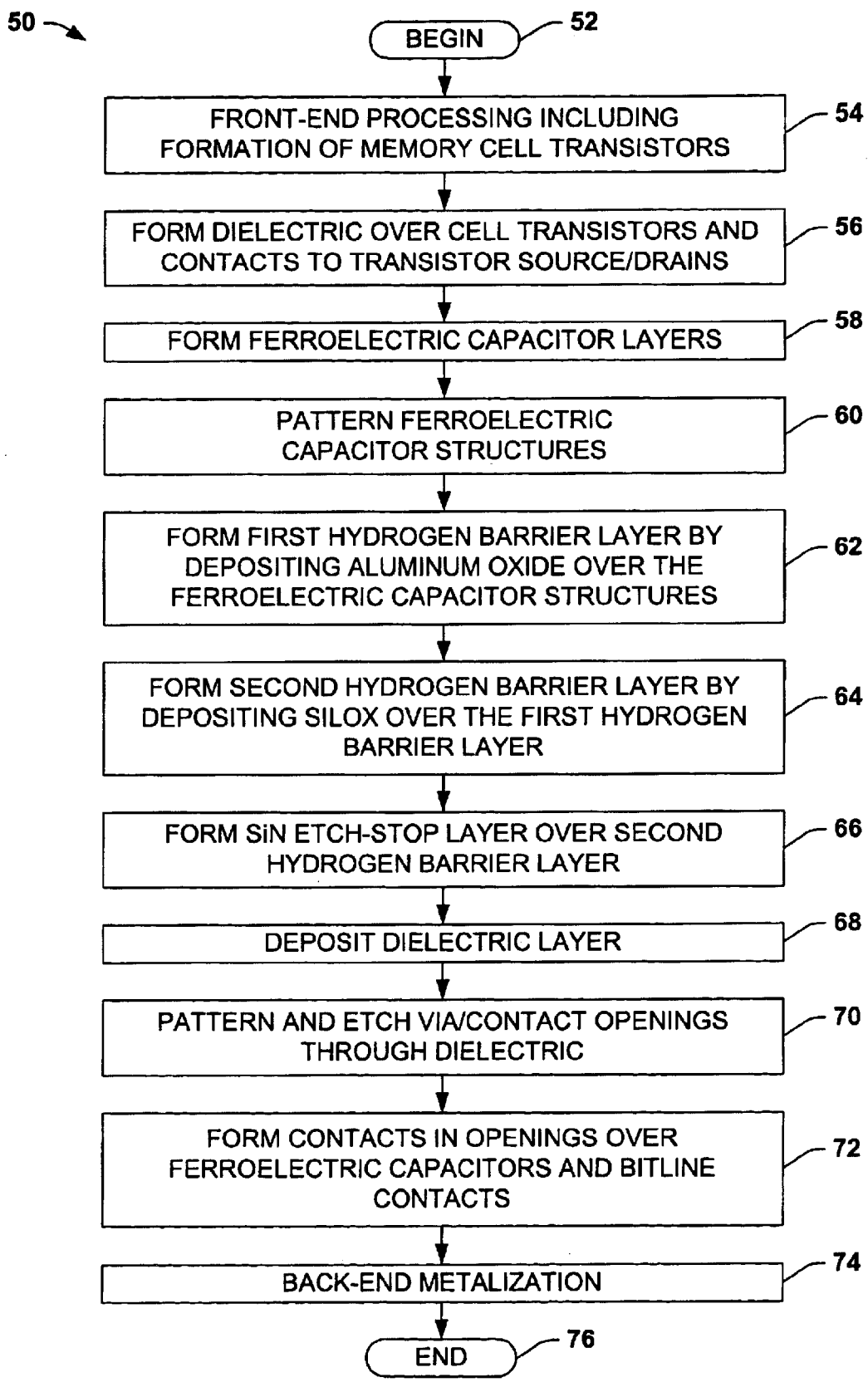
FIG. 3 is a flow diagram illustrating an exemplary method of fabricating a semiconductor device having ferroelectric memory cells with a hydrogen barrier comprising aluminum oxide (AlOx) and silicon rich silicon oxide (SILOX) layers in accordance with the present invention.

FIG. 3 illustrates an exemplary method 50 for fabricating semiconductor devices in accordance with an aspect of the present invention, wherein silicon rich silicon oxide (SILOX) is used to form a hydrogen barrier above ferroelectric capacitors. Although the method 50 and other exemplary methods are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices illustrated and described herein as well as in association with other devices and structures not illustrated. For example, the exemplary method 50 may be employed in fabricating a semiconductor device 102 as illustrated and described below with respect to FIGS. 4A–4H.

Beginning at 52, front-end processing is performed at 54, including formation of transistors for the ferroelectric memory cells. An initial inter-level or inter-layer dielectric (ILD) is formed at 56 over the cell transistors, referred to herein as a poly metal dielectric (PMD). Conductive contacts are formed through the PMD to provide electric connection to the transistor bitline source/drains (e.g., source/drain 12 in FIG. 1 above), as well as to the source/drains for connection with subsequently formed ferroelectric capacitors (e.g., source/drain 15 in FIG. 1). Any suitable front-end processing steps and materials may be employed at 54 and 56 within the scope of the invention.

At 58, ferroelectric capacitor layers are formed over the PMD and contacts, including formation of upper and lower conductive capacitor electrode or plate layers and a ferroelectric material layer between the electrode layers. The capacitor layers are then patterned at 60, for example, using suitable masking and etching steps to define ferroelectric capacitor structures having first and second conductive electrodes and a ferroelectric material disposed between the electrodes. A multi-layer hydrogen barrier is then formed at 62-64 above the ferroelectric capacitors to prevent or inhibit hydrogen diffusion into the ferroelectric material in subsequent (e.g., back-end) processing of the device. In the example of FIG. 3, a first hydrogen barrier layer is formed at 62 over the patterned ferroelectric capacitor structures by depositing aluminum oxide (AlOx) over the ferroelectric capacitors. Other materials may alternatively be deposited at 62 that do not react with the ferroelectric material of the capacitors below. In one example, AlOx is deposited at 62 to a thickness of about 400 Å using physical vapor deposition (PVD). In another implementation, AlOx is deposited to a thickness of about 100 Å at 62 using atomic layer deposition (ALD), although other materials and deposition processes are possible within the scope of the invention, where a non-reactive material is formed over or above the ferroelectric capacitors. In this regard, a first hydrogen barrier layer within the scope of the present invention may be any type of liner, which may but need not inhibit hydrogen diffusion.

At 64, a second hydrogen barrier layer is formed by deposition of silicon rich silicon oxide (SILOX) over the AlOx layer. In one example, SILOX is deposited at 64 to a thickness of about 300–500 Å using plasma-enhanced physical vapor deposition (PECVD), wherein the content of silane gas (e.g., silicon hydride $SiH_4$) may be used to control the stoichiometry of the material in the second hydrogen barrier layer. Any suitable process may be employed at 64 to form the second hydrogen barrier layer of SILOX within the scope of the invention. Alternatively, amorphous silicon may be formed at 64 over the first hydrogen barrier layer using any suitable deposition process. Although the first barrier layer (e.g., AlOx) operates to retard the diffusion of hydrogen into the underlying ferroelectric material, the inventors have appreciated that the formation of a SILOX or amorphous silicon layer over the AlOx aids in preventing or mitigating hydrogen related degradation of the ferroelectric. In this regard, the SILOX material may be any non-stoichiometric silicon rich silicon oxide within the scope of the invention.

The inventors have found that increased silicon content in silicon oxide (e.g., through controlled silane gas content and/or pressure control during PECVD deposition at 64), results in a deposited second hydrogen barrier layer (SILOX) having a higher silicon content and a higher refractive index (RI) than stoichiometric silicon oxide, and correspondingly greater hydrogen-stopping characteristics. For example, the SILOX layer may be formed having a refractive index up to about 1.8. While not wishing to be tied to any particular theory, it is believed that increasing the silane content increases silicon content in the deposited film, which results in an increased propensity of dangling bonds that can trap atomic hydrogen. The increased concentration of dangling bonds is believed to improve the ability of the SILOX material to trap hydrogen introduced in subsequent (e.g., back-end) processing. In addition to silane gas control, the inventors have found that controlling the pressure during the PECVD deposition process provides control over the ability of the resulting SILOX layer to inhibit hydrogen diffusion.

The following Table 1 provides recipe settings used in experiments for forming SILOX hydrogen barrier layers of 500 and 5000 Å as part of a bi-layer hydrogen barrier in accordance with the invention, wherein the process parameters below may be employed in fabricating a SILOX layer in accordance with the invention. In Table 1, $SiH_4$, $N_2$, and $N_2O$ refer to silane, $N_2$, and nitrous oxide gas flow rates in sccm, respectively, HFRF refers to high frequency power in watts for the PECVD process at 64, LFRF refers to low frequency process power in watts, and Pres refers to deposition process pressure in Torr.

TABLE 1

| | Recipe Settings | | | | | |
|---|---|---|---|---|---|---|
| Recipe Number | $SiH_4$ | HFRF | LFRF | $N_2$ | $N_2O$ | Pres |
| I | 300 | 1100 | 0 | 1500 | 9500 | 2.4 |
| II | 154 | 300 | 90 | 3800 | 3800 | 1.6 |
| III | 300 | 1100 | 0 | 1500 | 9500 | 1.6 |
| IV | 400 | 1100 | 0 | 1500 | 9500 | 2.4 |
| V | 300 | 300 | 90 | 3000 | 3000 | 1.2 |

The following Table 2 presents experimental results for 5000 Å thick SILOX layers formed using the recipes of Table 1, wherein the SILOX layer Thickness is in Å, Ri is the refractive index of the deposited SILOX layer, and Range is the standard deviation of the SILOX layer thickness in Å.

TABLE 2

| Recipe Name | Thickness | Ri | Range | Dep Time (s) | Dep Rate (A/min.) |
|---|---|---|---|---|---|
| I | 5000.71 | 1.4588 | 107.52 | 9.70 | 30932.23 |
| II | 5040.41 | 1.5225 | 79.05 | 24.25 | 12471.12 |
| III | 4949.44 | 1.5046 | 269.22 | 13.50 | 21997.51 |
| IV | 5011.68 | 1.4712 | 75.93 | 7.71 | 39001.40 |
| V | 5099.79 | 1.6473 | 161.82 | 24.75 | 12363.13 |

The following Table 3 presents experimental results for 500 Å thick SILOX layers formed using the recipes of Table 1.

TABLE 3

| Recipe Name | Thickness | Ri | Range | Dep Time (s) | Dep Rate (A/min.) |
|---|---|---|---|---|---|
| I | 497.65 | 1.4511 | 13.52 | 1.70 | 17564.12 |
| II | 481.11 | 1.4979 | 12.99 | 3.10 | 9311.81 |
| III | 443.10 | 1.4827 | 14.16 | 1.87 | 14217.11 |
| IV | 428.46 | 1.4551 | 8.42 | 1.22 | 21071.80 |
| V | 489.89 | 1.6169 | 24.36 | 2.52 | 11664.05 |

Other process parameters may be employed in fabricating a SILOX layer beyond those provided in Table 1 above. Following SILOX deposition at 64, a silicon nitride (SiN) etch-stop layer is formed at 66 over the SILOX using any suitable deposition techniques, and an inter-level dielectric ILD is deposited at 68. The ILD dielectric is then patterned and etched at 70 to form via/contact openings for electrical coupling to the upper ferroelectric capacitor electrodes and to the previously formed bitline contacts in the underlying initial ILD layer. The openings are then filled with conductive material (e.g., copper, aluminum, tungsten, or other conductive material) at 72 to form the bitline and capacitor contacts in the current ILD (e.g., in the capacitor layer or level), and back-end (e.g., metalization or interconnect) processing is performed at 74 before the method 50 ends at 76.

Figure 4A:
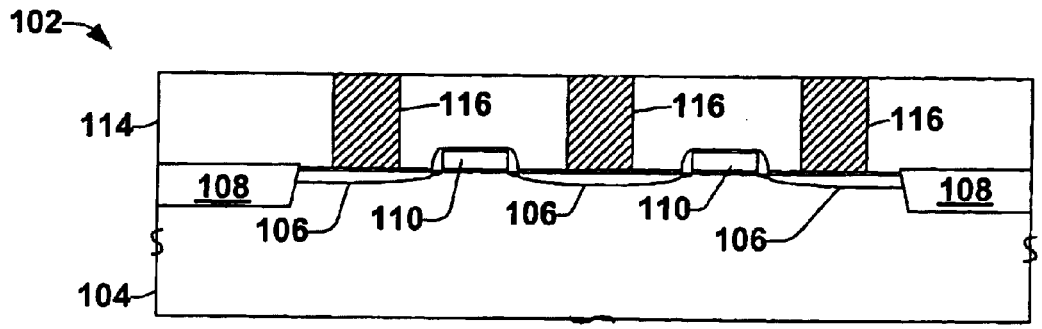
FIGS. 4A–4H are partial side elevation views in section illustrating an exemplary semiconductor device having a multilayer hydrogen barrier in accordance with the invention undergoing fabrication processing generally in accordance with the method of FIG. 3.

Referring now to FIGS. 4A–4H, an exemplary semiconductor device 102 is illustrated undergoing fabrication processing according to the present invention, wherein the device 102 is processed generally according to the method 50 to include a bi-layer hydrogen barrier above the ferroelectric capacitors. In the examples illustrated and described herein, the structures are not necessarily drawn to scale, and generally may be fabricated using any suitable semiconductor processing techniques. FIG. 4A illustrates the device 102 after front-end processing in which cell transistors and an initial inter-level dielectric layer have been formed with contacts formed to couple the transistor source/drains.

The device 102 includes a semiconductor body 104 (e.g., silicon substrate or SOI wafer) in which transistor source/drains 106 are formed in active regions separated by STI or LOCOS isolation structures 108, wherein gate structures 110 are formed over channel regions of the substrate 104 as part of polysilicon wordline structures for a ferroelectric memory array. MOS type cell transistors are formed by the gates 110 and the source/drains 106, wherein the source/drains 106 are formed by doping portions of active regions in the substrate, and wherein the source/drain 106 coupled with the bitline in the memory array (e.g., the middle source/drain 106 in FIGS. 4A–4H) is shared between adjacent transistors. An initial ILD layer (e.g., poly metal dielectric, PMD) 114 is formed over the transistors and the substrate 104, through which conductive contacts 116 are formed for interconnection of the source/drain terminals 106, where the contacts 116 may be formed of any conductive material or materials, such as tungsten or the like.

Figure 4B:
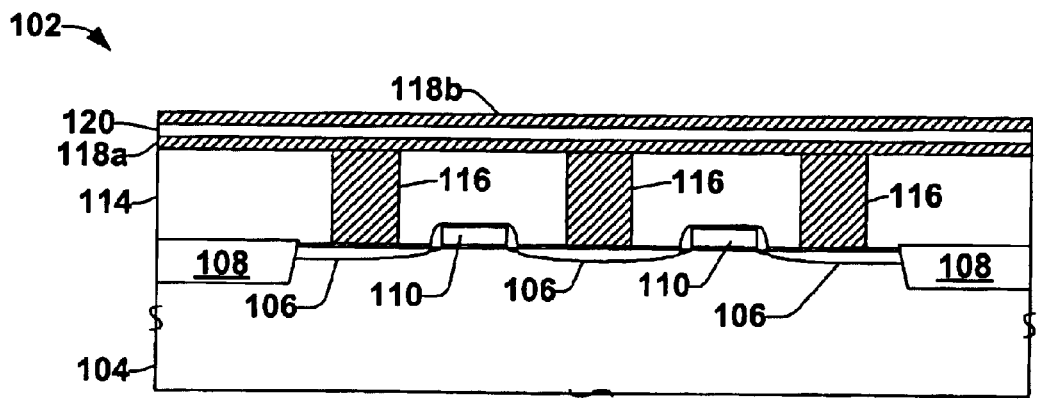
Figure 4C:
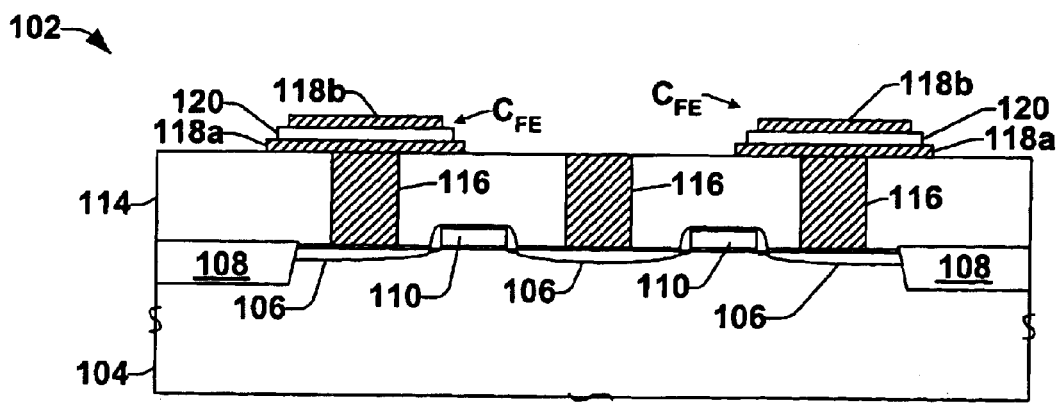

Ferroelectric cell capacitors $C_{FE}$ are then formed over the PMD dielectric layer 114, as illustrated in FIGS. 4B and 4C. In FIG. 4B, the capacitor layers are deposited, including upper and lower conductive electrode or plate layers 118b and 118a, respectively, with a ferroelectric material layer 120 formed between the electrode layers 118. The capacitor electrodes 118 may be formed of any suitable material or combination of multiple layers of materials. In one example, a diffusion barrier is first created comprising TiN formed over the PMD dielectric 114 and the tungsten contacts 116 via chemical vapor deposition (CVD) with a TiAlN film or a TiAlON being deposited thereover using a physical vapor deposition (PVD) or other process. The bottom electrode material 118a is then formed over the diffusion barrier, for example, comprising any conductive material such as Pt, Pd, PdOx, IrPt alloys, Au, Ru, $RuO_x$, $(Ba,Sr,Pb)RuO_3$, $(Sr,Ba,Pb)IrO_3$, Rh, $RhO_x$, $LaSrCoO_3$, $(Ba,Sr)RuO_3$, $LaNiO_3$, etc., or any stack or combination thereof.

Ferroelectric material 120 is deposited over the lower electrode material 118a using any appropriate deposition techniques such as metal organic chemical vapor deposition (MOCVD) using any suitable ferroelectric materials, including but not limited to $Pb(Zr,Ti)O_3$ PZT (lead zirconate titanate), doped PZT with donors (Nb, La, Ta) acceptors (Mn, Co, Fe, Ni, Al) and/or both, PZT doped and alloyed with $SrTiO_3$, $BaTiO_3$ or $CaTiO_3$, strontium bismuth tantalate (SBT) and other layered perovskites such as strontium bismuth niobate tantalate (SBNT) or bismuth titanate, $BaTiO_3$, $PbTiO_3$, $Bi_2TiO_3$, etc. The top electrode material 118b may be a single layer or a multi-layer conductive structure such as $IrO_x$, $RuO_x$, $RhO_x$, $PdO_x$, $PtO_x$, $AgO_x$, $(Ba,Sr)RuO_3$, $LaSrCoO_3$, $LaNiO_3$, $YBa_2Cu_3O_{7-x}$ with a noble metal layer thereover, wherein the layers 118 and 120 may be formed to any desired thickness in accordance with the invention. As illustrated in FIG. 4C, the ferroelectric capacitor material layers are then patterned using masking and etch processes (not shown) to define the ferroelectric capacitor structures $C_{FE}$ having any desired size (area) and shape. In the exemplary array configuration of the device 102, the first contacts 116 couple the lower capacitor electrodes 118a with a first source/drain 106 of the cell transistors, and the shared source/drain is coupled with another contact 116 for connection with a subsequently formed bitline structure for reading and writing data.

Figure 4D:
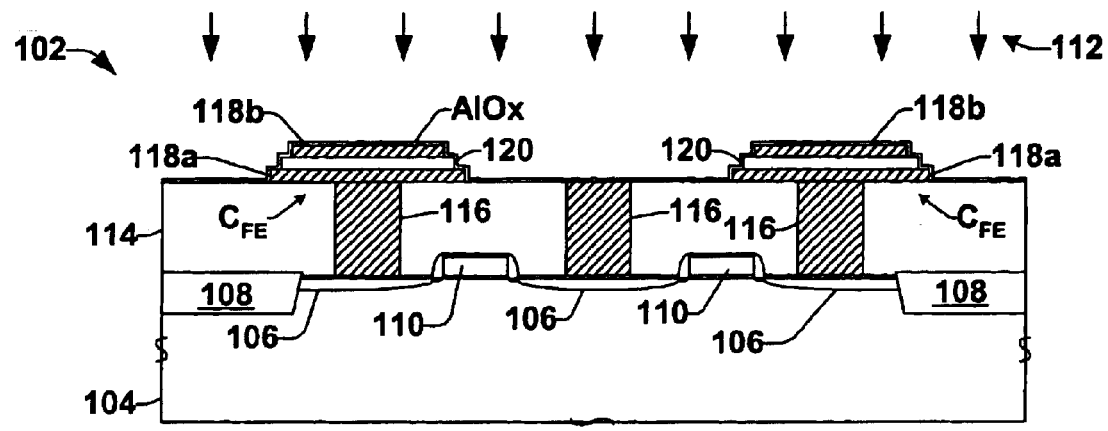
Figure 4E:
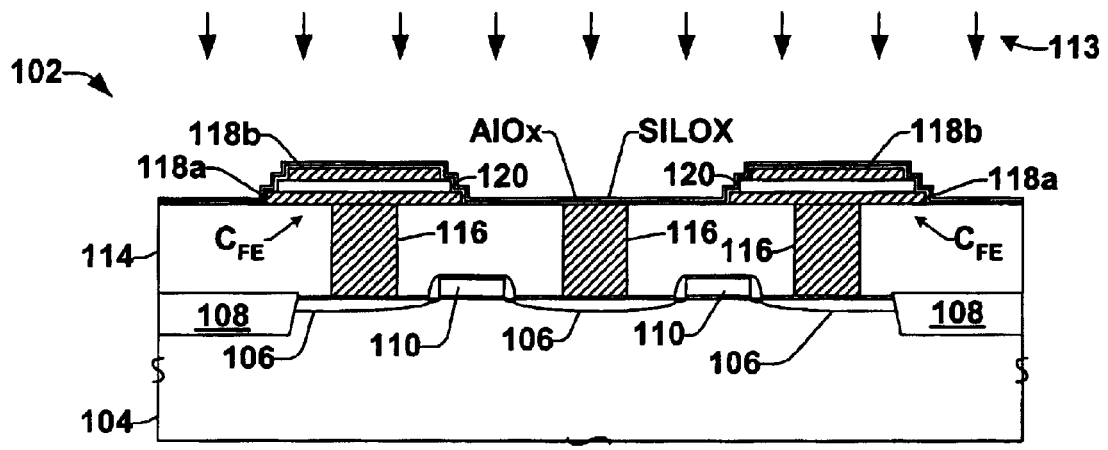
Figure 4F:
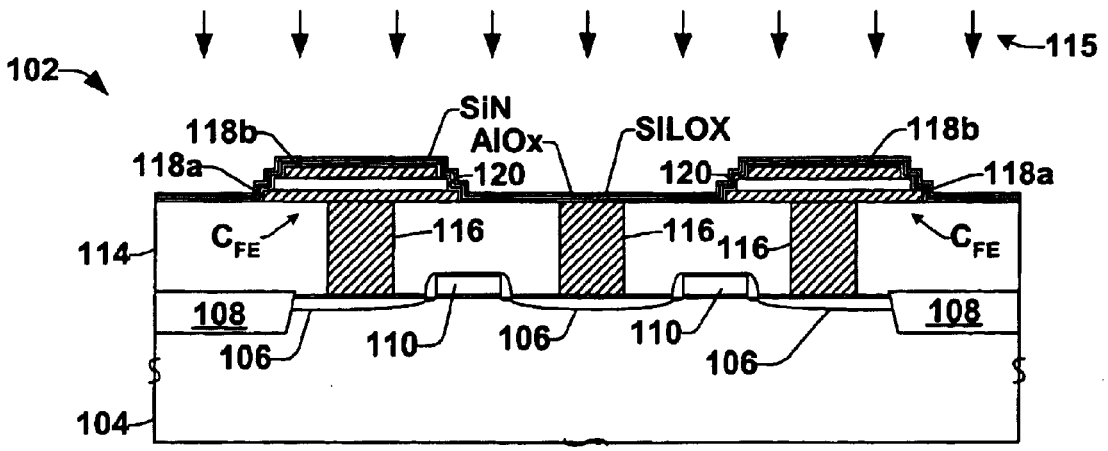

Referring now to FIGS. 4D and 4E, a multilayer hydrogen barrier is then formed above the ferroelectric capacitors $C_{FE}$ in accordance with the invention. In FIG. 4D, a deposition process 112 is employed to form a first hydrogen barrier layer AlOx that may be aluminum oxide or any other material that does not react with the ferroelectric material 120 of the capacitors $C_{FE}$ to any thickness. In one example, the process 112 is a PVD process providing the aluminum oxide layer AlOx having a thickness of about 400 Å. In another possible implementation, an ALD process 112 is used to deposit the AlOx layer to a thickness of about 100 Å. In FIG. 4E, a second hydrogen barrier layer SILOX is formed to a thickness of about 300–500 Å over the AlOx layer using a PECVD process 113, although other deposition processes and thickness can be used within the scope of the invention. Alternatively, an amorphous silicon layer can be deposited using any suitable process 113 to form the second hydrogen barrier layer to any thickness. A SiN etch-stop layer is then deposited in FIG. 4F over the SILOX using a deposition process 115.

Figure 4G:
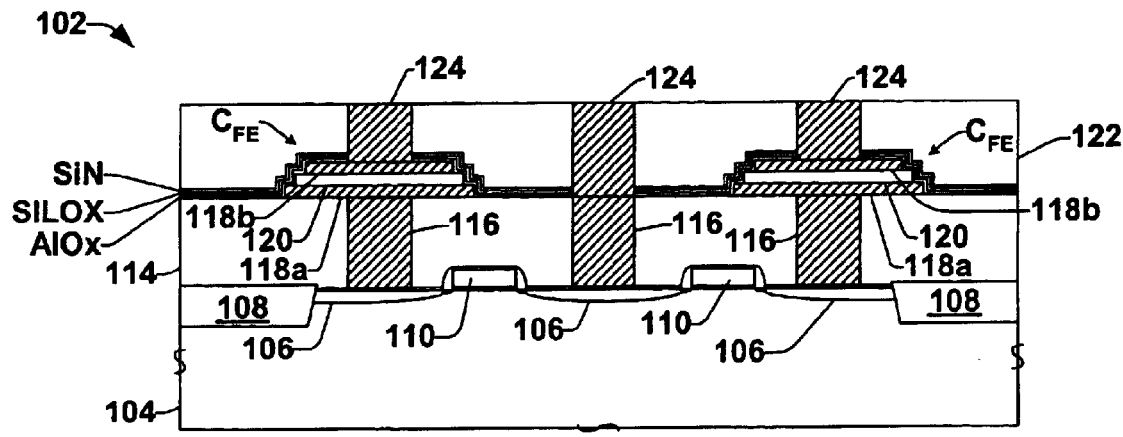
Figure 4H:
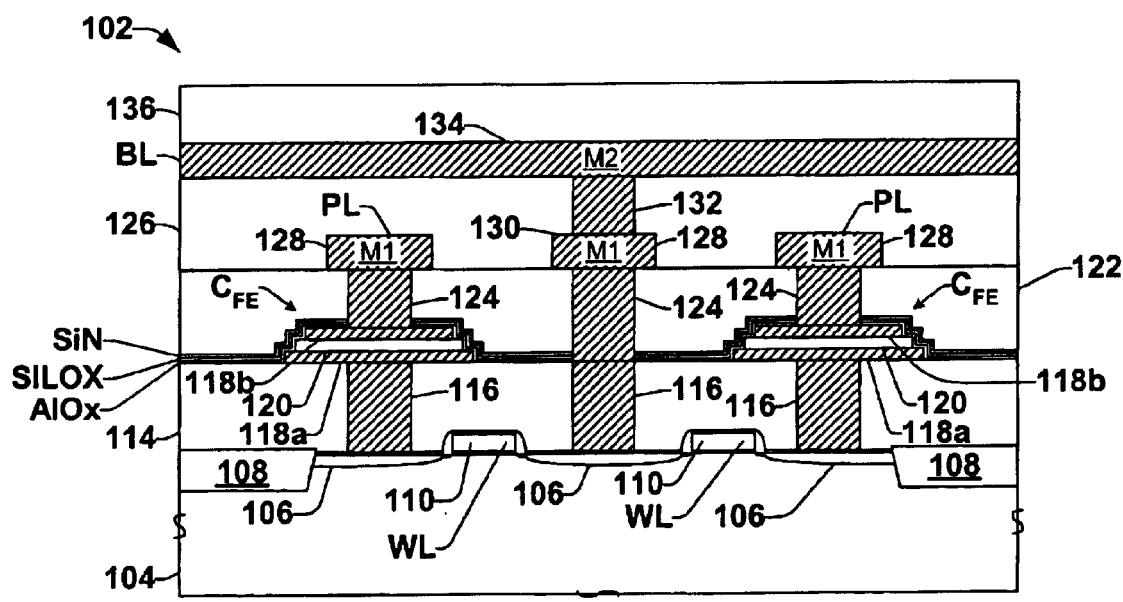

Referring now to FIG. 4G, a second ILD layer 122 is formed over the capacitors $C_{FE}$, the bitline contacts 106, and the PMD dielectric 114, where the ILD material 122 may be silicon dioxide ($SiO_2$), FSG, or other suitable dielectric. As discussed below with respect to FIGS. 8–10D, moreover, the second ILD material 122 may optionally be SILOX for protecting the ferroelectric material 120 from hydrogen in back-end processing in accordance with another aspect of the invention. Conductive via structures 124 are formed through the ILD dielectric 122 to couple with the upper capacitor plates 118b and the bitline contacts 116 of the first layer. A third ILD dielectric layer 126 is then formed over the dielectric 122 as illustrated in FIG. 4H, and a first layer of metal interconnect structures (M1) is formed therein, including conductive plateline routing structures 128 and landing pads 130 for the bitline connections. Bitline connection vias 132 are then formed through the dielectric 126 to connect the landing pads 130 with a bitline structure 134 in a second metalization layer M2 in a subsequent dielectric layer 136.

Figure 5:
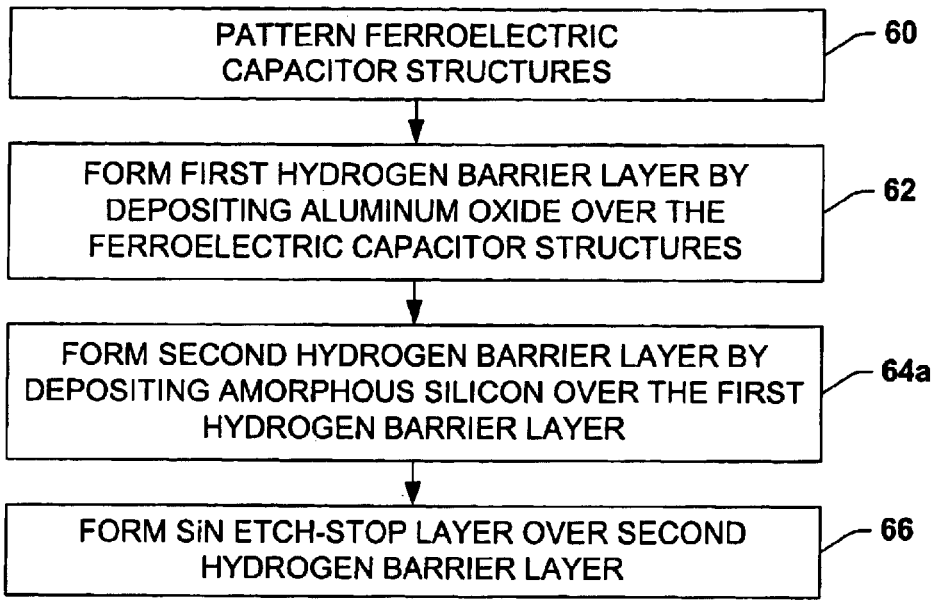
FIG. 5 is a partial flow diagram illustrating an alternative implementation of the method of FIG. 3 using a hydrogen barrier having an amorphous silicon layer in accordance with the invention.
Figure 6:
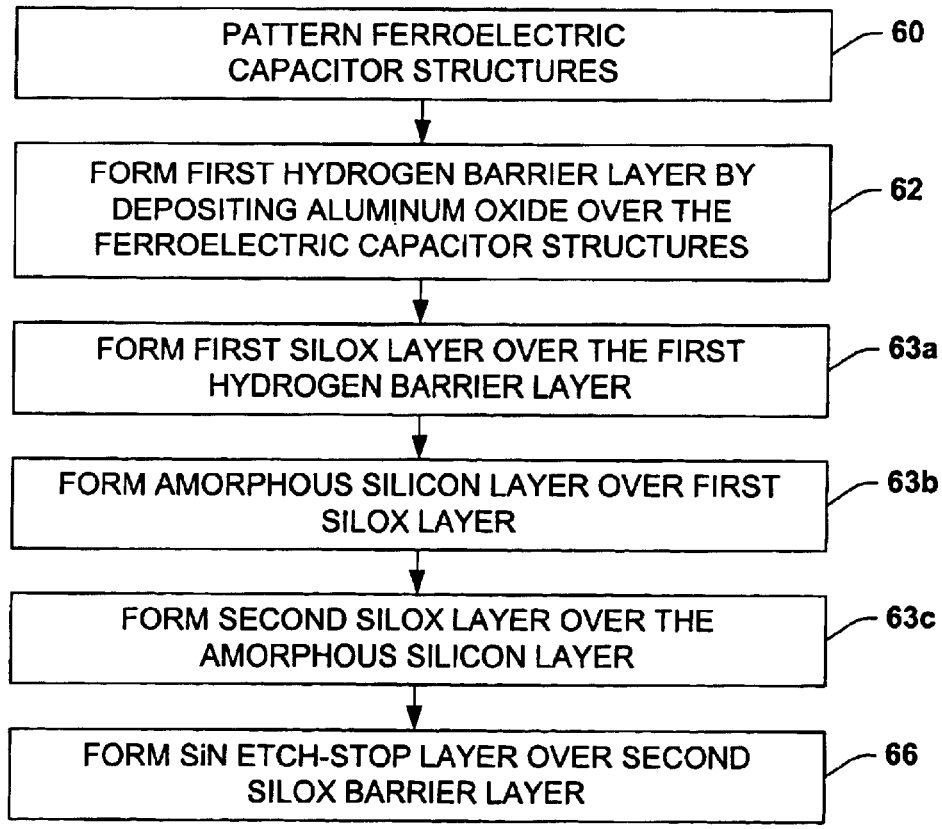
FIG. 6 is a partial flow diagram illustrating another alternative implementation of the method of FIG. 3 employing a hydrogen barrier with an amorphous silicon layer between first and second SILOX layers in accordance with the invention.
Figure 7A:
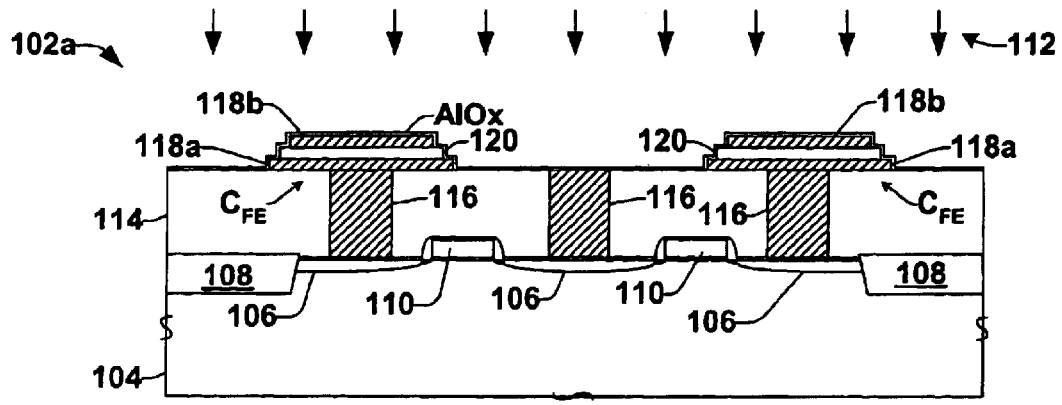
FIGS. 7A–7F are partial side elevation views in section illustrating another exemplary semiconductor device with a multilayer hydrogen barrier undergoing fabrication processing generally in accordance with the method of FIGS. 3 and 6.
Figure 7B:
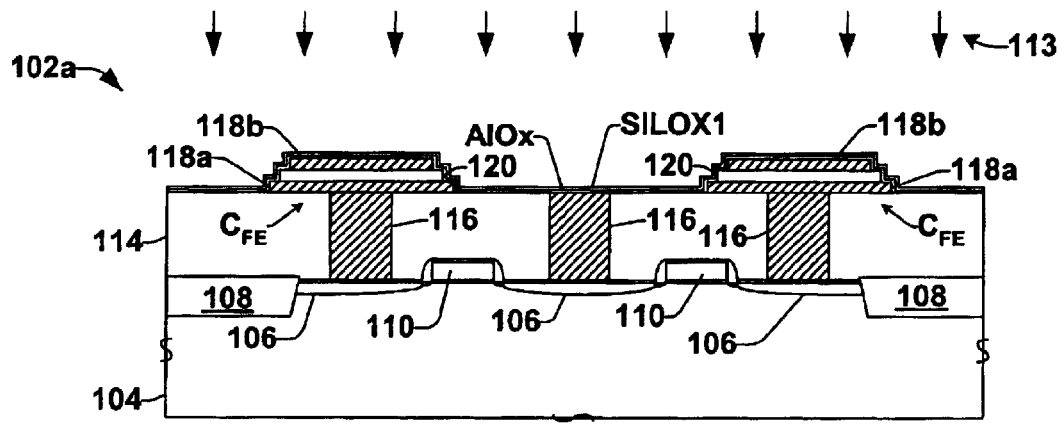
Figure 7C:
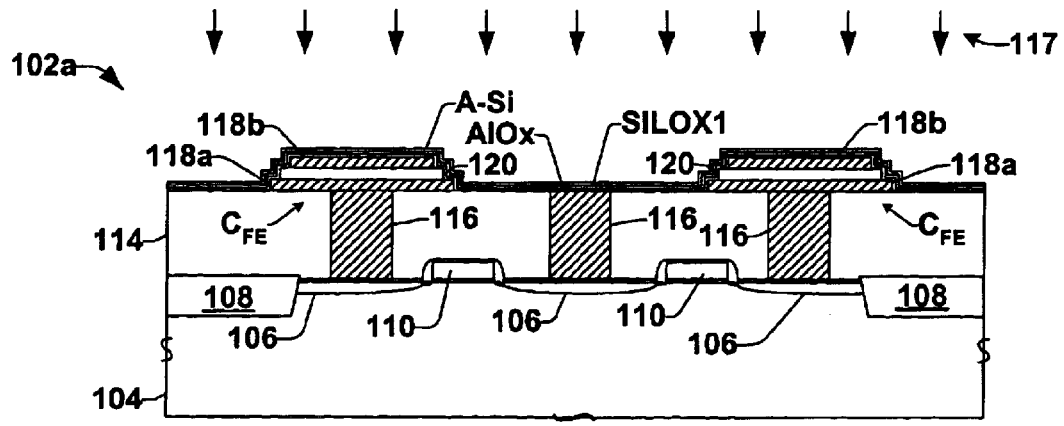
Figure 7D:
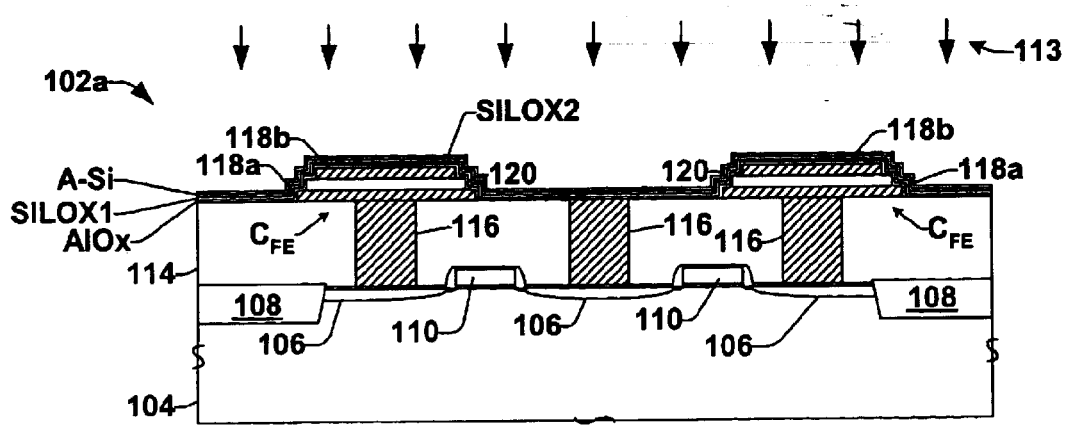
Figure 7E:
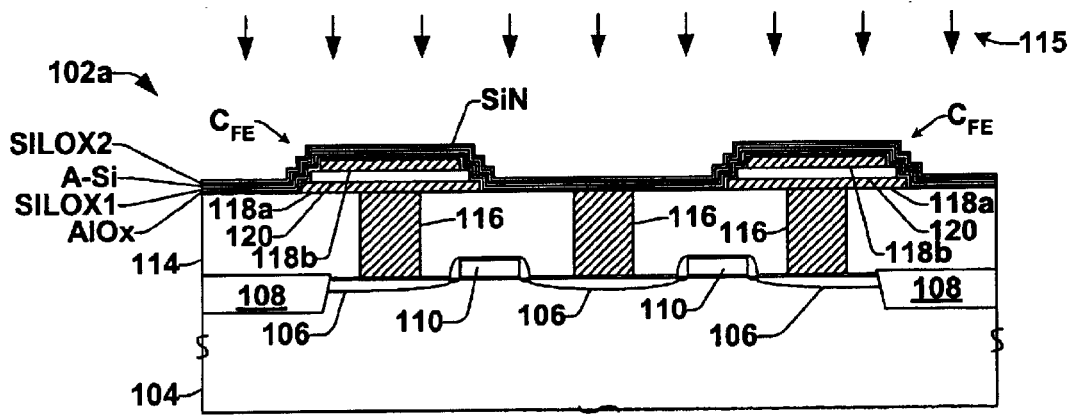
Figure 7F:
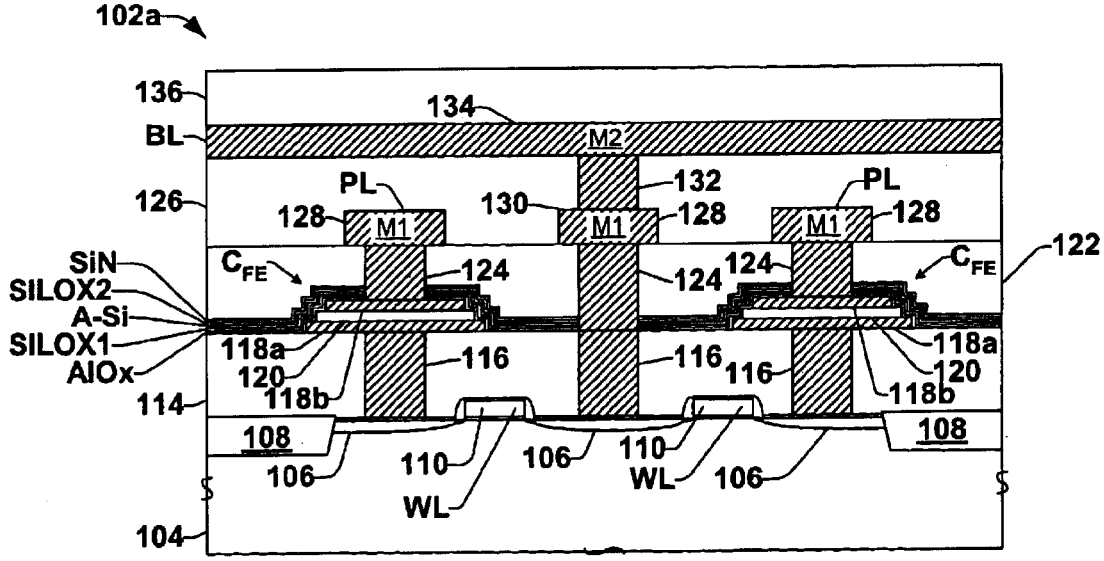

Referring now to FIGS. 3 and 5, FIG. 5 provides an alternative implementation of a portion of the method 50 in accordance with the present invention. After the ferroelectric capacitor layers are patterned at 60, a multi-layer hydrogen barrier is formed at 62–64a (FIG. 5). As with the above example, the first hydrogen barrier layer is formed by depositing, for example, aluminum oxide over the ferroelectric capacitor structures at 62 (e.g., first layer AlOx is deposited via process 112 as illustrated in FIG. 4D above). In this alternative example, however, the second hydrogen barrier layer is formed by depositing amorphous silicon over the AlOx at 64a. Thereafter, the etch stop layer (e.g., SiN) is formed over the second hydrogen barrier layer at 66, and the method 50 proceeds as illustrated and described above with respect to FIG. 3.

Another possible implementation is illustrated and described below with respect to FIGS. 3, 6, and 7A–7F. In this alternative, a multilayer hydrogen barrier is formed above the ferroelectric capacitors, including, for example, an aluminum oxide layer and two SILOX layers with amorphous silicon formed therebetween. Following patterning of the ferroelectric capacitors at 60, the first hydrogen barrier layer is formed by depositing aluminum oxide over the ferroelectric capacitor structures at 62 (e.g., AlOx layer formed using deposition process 112 in FIG. 7A), where alternate materials may be employed for the first hydrogen barrier layer that do not react with the ferroelectric material. A second hydrogen barrier layer is formed by depositing a first SILOX layer over the AlOx at 63a (e.g., SILOX1 formed using process 113 in FIG. 7B). An amorphous silicon layer is formed at 63b (e.g., A-Si layer deposited over SILOX1 using a process 117 in FIG. 7C), and a second silicon rich silicon oxide layer is formed over the amorphous silicon at 63c (e.g., SILOX2 deposited via process 113 in FIG. 7D). Thereafter, the etch stop layer (e.g., SiN) is formed at 66 over the second hydrogen barrier (e.g., using process 115 in FIG. 7E), and the method 50 proceeds as illustrated and described above with respect to FIG. 3 to provide the device 102a in FIG. 7F.

Figure 8:
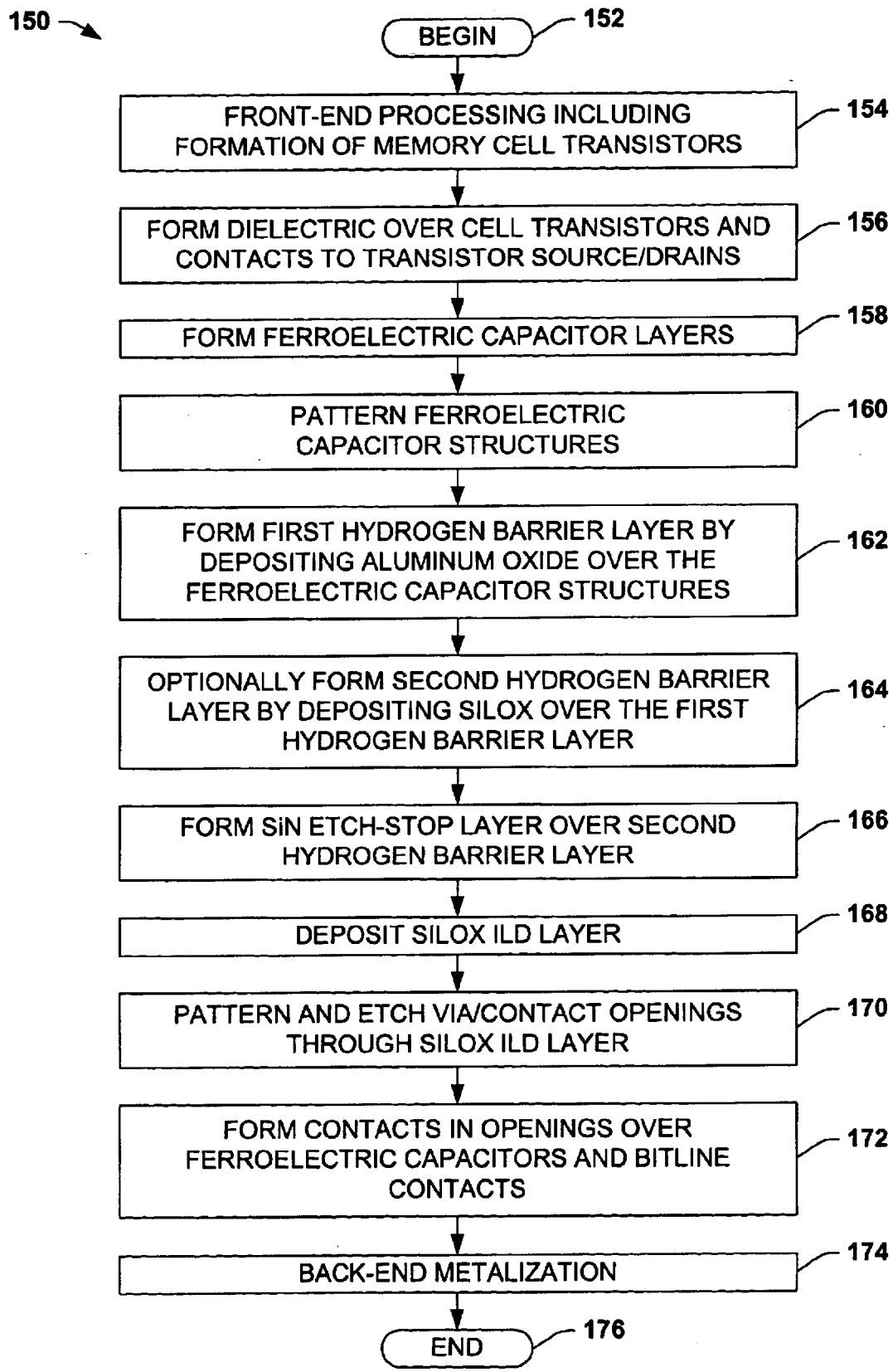
FIG. 8 is a flow diagram illustrating another method for fabricating a semiconductor device using a hydrogen barrier having a SILOX ILD layer above the ferroelectric capacitors in accordance with the invention.

Another exemplary method 150 is illustrated in FIG. 8, wherein a silicon rich silicon oxide is used as an ILD above the ferroelectric capacitors to provide a barrier against hydrogen during back-end processing. FIGS. 9A–9E illustrate a semiconductor device 102b fabricated according to the method 150, including an optional SILOX layer between a first hydrogen barrier layer (e.g., AlOx) and an etch-stop (e.g., SiN) layer. FIGS. 10A–10D illustrate an alternate implementation of the method 150, wherein a device 102c is provided with a SILOX ILD, wherein the SiN etch-stop layer is formed directly over the AlOx layer above the ferroelectric capacitors.

Beginning at 152, front-end processing is performed at 154, including formation of cell transistors for the ferroelectric memory array. An initial inter-level dielectric (PMD) is formed at 156 over the cell transistors (e.g., PMD 114 in FIGS. 9A and 10A), and conductive contacts are formed through the ILD to provide electric connection to the transistor bitline source/drains (e.g., contacts 116 coupled to the source/drains 106 in FIGS. 9A and 10A). Ferroelectric capacitor layers are formed at 158 (electrode layers 118a and 118b and ferroelectric material layer 120), which are then patterned at 160 to provide ferroelectric capacitor structures (capacitors $C_{FE}$ in FIGS. 9A and 10A).

Figure 9A:
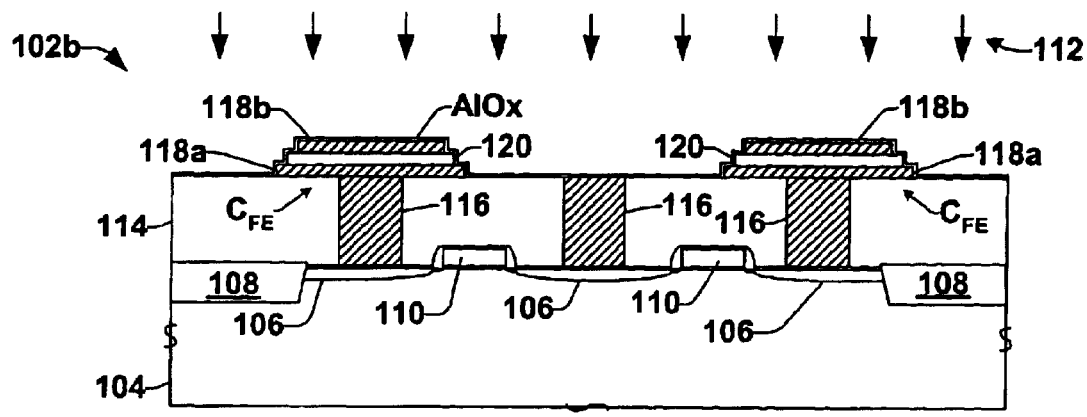
FIGS. 9A–9E are partial side elevation views in section illustrating an exemplary semiconductor device having an AlOx layer and an optional first SILOX layer above the ferroelectric cell capacitors, as well as a SILOX ILD layer undergoing fabrication processing generally in accordance with the method of FIG. 8.
Figure 9B:
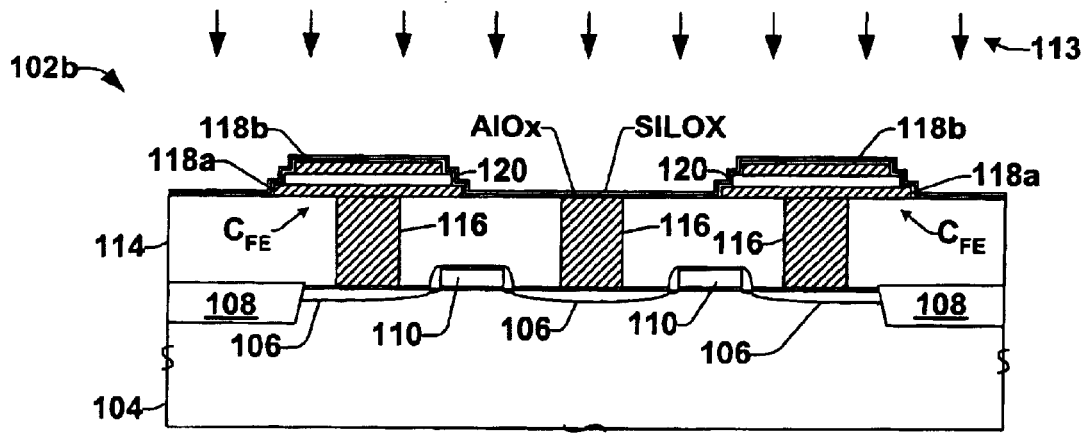
Figure 9C:
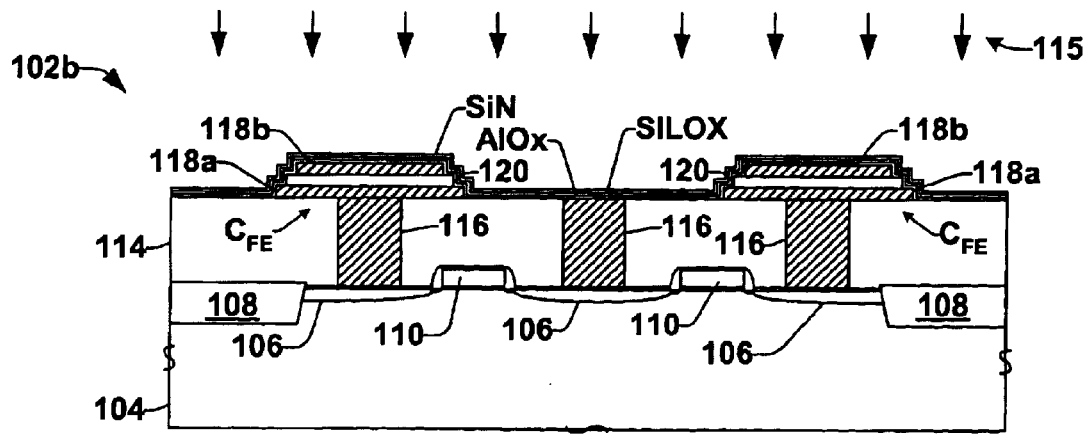
Figure 9D:
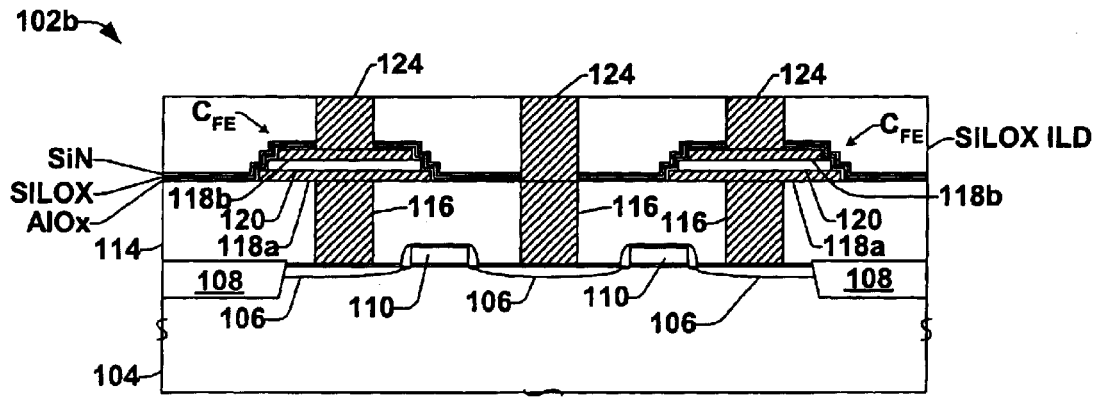
Figure 9E:
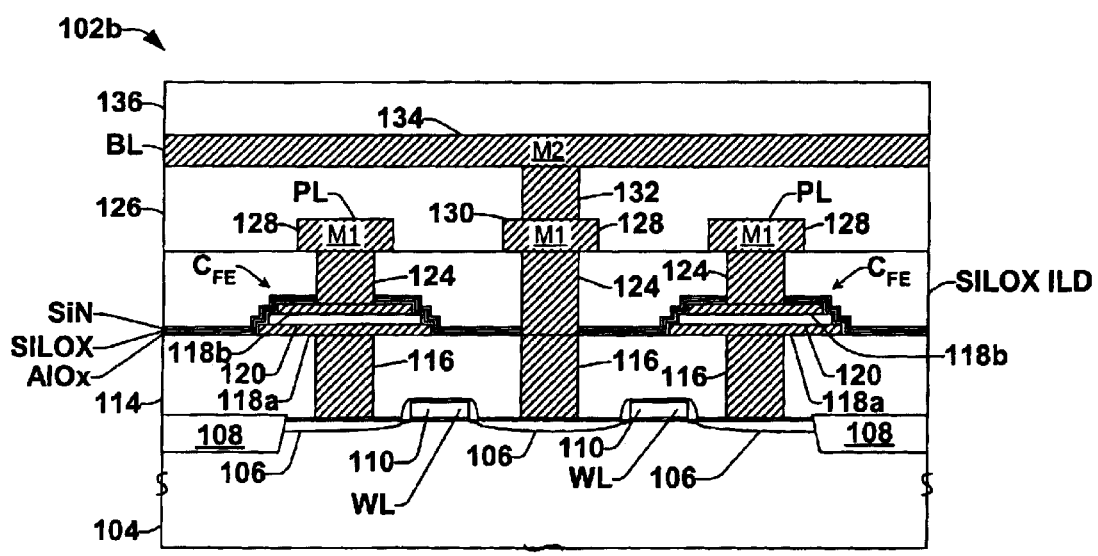
Figure 10A:
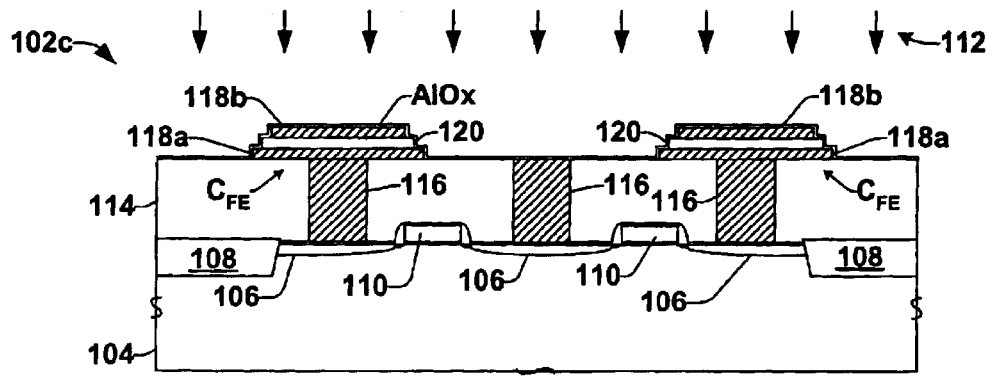
FIGS. 10A–10D are partial side elevation views in section illustrating another exemplary semiconductor device having an AlOx layer and a SILOX ILD layer undergoing fabrication processing generally in accordance with the method of FIG. 8.
Figure 10B:
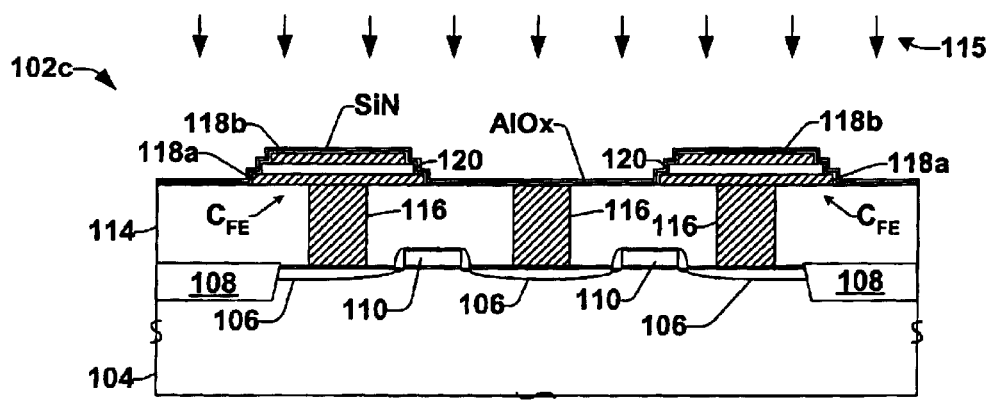
Figure 10C:
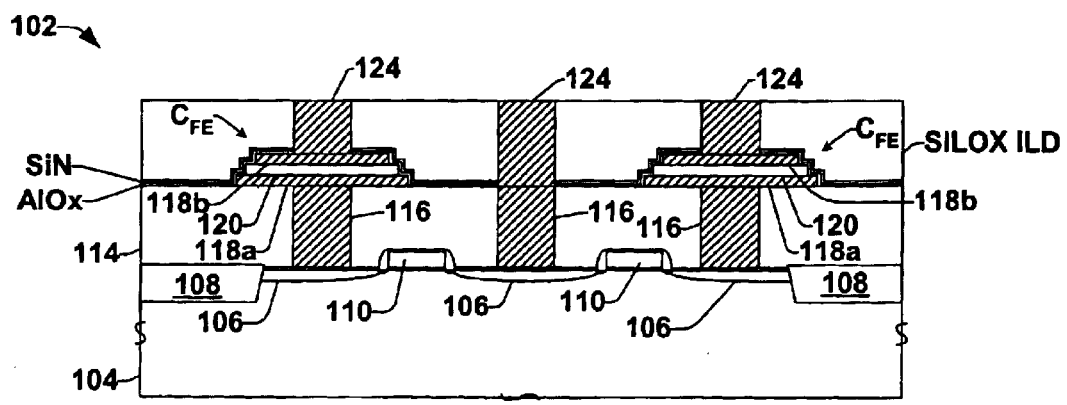
Figure 10D:
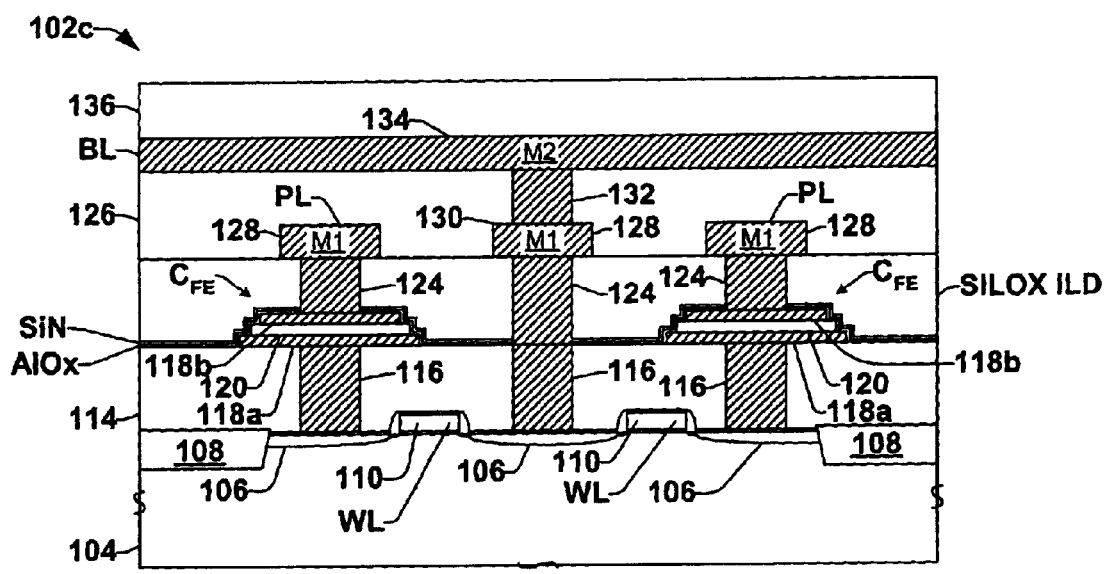

A first hydrogen barrier layer is then formed at 162 (e.g., AlOx layer in FIGS. 9A and 10A), for example, by depositing aluminum oxide (AlOx) over the ferroelectric capacitors (e.g., using process 112 in FIGS. 9A and 10A). Other materials may alternatively be deposited at 162 that do not react with the ferroelectric material 120 of the capacitors. At 164, a second hydrogen barrier layer may optionally be formed by deposition of silicon rich silicon oxide over the AlOx layer (SILOX layer deposited via process 113 in FIG. 9B). With or without the optional SILOX formation at 164, the method 150 proceeds to 166 in FIG. 8, where an etch-stop layer is formed (e.g., SiN layer deposited via deposition process 115 in FIGS. 9C and 10B).

At 168, an inter-level dielectric (ILD) layer is formed by depositing silicon rich silicon oxide (e.g., SILOX ILD layers of FIGS. 9D and 10C) and contacts/vias 124 are formed through the SILOX ILD at 170 and 172 to contact the underlying bitline contacts 116 and the upper ferroelectric capacitor electrodes 118b. Thereafter, back-end metalization or interconnect processing is performed at 174 before the method 150 ends at 176 to provide the devices 102b and 102c in FIGS. 9E and 10D, respectively. The SILOX ILD may be deposited at 168 using the same process 112 as used for the other SILOX layers described herein or other processes optimized for increased deposition rate, wherein the SILOX ILD will generally be much thicker. The SILOX ILD provides a barrier to hydrogen diffusion which may compliment the protection provided by the AlOx layer and/or the optional first SILOX layer under the SiN etch-stop layer (e.g., FIG. 9E). In another alternative implementation of the invention, the AlOx layer may be omitted and the SiN etch-stop layer may be formed directly over the ferroelectric capacitors, with a SILOX ILD layer formed thereover to provide a hydrogen barrier.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device, comprising:
   forming a ferroelectric capacitor in a capacitor layer above a semiconductor body; and
   forming a hydrogen barrier over and in contact with a side of the ferroelectric capacitor, wherein the hydrogen barrier comprises silicon rich silicon oxide or amorphous silicon, wherein forming the hydrogen barrier comprises:
   forming a first hydrogen barrier layer over the ferroelectric capacitor; and
   forming a second hydrogen barrier layer above the first hydrogen barrier layer, the second hydrogen barrier layer comprising silicon rich silicon oxide or amorphous silicon.

2. The method of claim 1, wherein the first hydrogen barrier layer comprises a material that does not react with a ferroelectric material of the ferroelectric capacitor.

3. The method of claim 2, wherein the first hydrogen barrier layer comprises aluminum oxide.

4. The method of claim 3, wherein the second hydrogen barrier layer comprises silicon rich silicon oxide.

5. The method of claim 1, wherein the second hydrogen barrier layer comprises amorphous silicon.

6. The method of claim 1, wherein forming the second hydrogen barrier layer comprises forming silicon rich silicon oxide over the first hydrogen barrier layer, and wherein forming the hydrogen barrier further comprises:

forming a third hydrogen barrier layer over the second hydrogen barrier layer, the third hydrogen barrier layer comprising amorphous silicon; and forming a fourth hydrogen barrier layer over the third hydrogen barrier layer, the fourth hydrogen barrier layer comprising silicon rich silicon oxide.

7. The method of claim 1, wherein the second hydrogen barrier layer comprises silicon rich silicon oxide, and wherein the second hydrogen barrier layer is an inter-level dielectric.

8. A method of fabricating a semiconductor device, comprising:

forming a ferroelectric capacitor in a capacitor layer above a semiconductor body; and forming a multilayer hydrogen barrier over and in contact with a side of the ferroelectric capacitor, wherein the hydrogen barrier comprises at least one silicon rich silicon oxide layer.

9. The method of claim 8, wherein forming the multilayer hydrogen barrier comprises forming at least one aluminum oxide layer above the ferroelectric capacitor.

10. The method of claim 8, forming the multilayer hydrogen barrier comprises forming a silicon rich silicon oxide inter-level dielectric above the ferroelectric capacitor.

11. The method of claim 8, wherein forming the multilayer hydrogen barrier comprises forming at least one amorphous silicon layer above the ferroelectric capacitor.

12. The method of claim 8, wherein forming the multilayer hydrogen barrier comprises:

forming an aluminum oxide layer over the ferroelectric capacitor; and forming a first silicon rich silicon oxide layer over the aluminum oxide layer.

13. The method of claim 12, wherein forming the multilayer hydrogen barrier further comprises forming an amorphous silicon layer over the first silicon rich silicon oxide layer and forming a second silicon rich silicon oxide layer over the aluminum oxide layer.

14. A semiconductor device, comprising:

a ferroelectric capacitor formed in a capacitor layer above a semiconductor body; and a hydrogen barrier over and in contact with a side of the ferroelectric capacitor, the hydrogen barrier comprising silicon rich silicon oxide or amorphous silicon, wherein the hydrogen barrier comprises:

a first hydrogen barrier layer formed over the ferroelectric capacitor; and a second hydrogen barrier layer formed over the first hydrogen barrier layer, the second hydrogen barrier layer comprising silicon rich silicon oxide or amorphous silicon.

15. The semiconductor device of claim 14, wherein the first hydrogen barrier layer comprises a material that does not react with a ferroelectric material of the ferroelectric capacitor.

16. The semiconductor device of claim 15, wherein the first hydrogen barrier layer comprises aluminum oxide.

17. The semiconductor device of claim 16, wherein the second hydrogen barrier layer comprises silicon rich silicon oxide.

18. The semiconductor device of claim 14, wherein the second hydrogen barrier layer comprises amorphous silicon.

19. The semiconductor device of claim 14, wherein the second hydrogen barrier layer comprises silicon rich silicon oxide, and wherein the hydrogen barrier further comprises:

a third hydrogen barrier layer formed over the second hydrogen barrier layer, the third hydrogen barrier layer comprising amorphous silicon; and a fourth hydrogen barrier layer formed over the third hydrogen barrier layer, the fourth hydrogen barrier layer comprising silicon rich silicon oxide.

20. The semiconductor device of claim 14, wherein the first hydrogen barrier layer comprises aluminum oxide, and wherein the second hydrogen barrier layer comprises silicon rich silicon oxide, further comprising forming an inter-level dielectric layer above the second hydrogen barrier layer, the inter-level dielectric layer comprising silicon rich silicon oxide.

21. A semiconductor device, comprising:

a ferroelectric capacitor formed in a capacitor layer above a semiconductor body; and a multilayer hydrogen barrier formed over and in contact with a side of the ferroelectric capacitor, the hydrogen barrier comprising at least one silicon rich silicon oxide layer.

22. The semiconductor device of claim 21, wherein the multilayer hydrogen barrier comprises at least one aluminum oxide layer formed above the ferroelectric capacitor.

23. The semiconductor device of claim 21, wherein the multilayer hydrogen barrier comprises a silicon rich silicon oxide inter-level dielectric formed above the ferroelectric capacitor.

24. The semiconductor device of claim 21, wherein the multilayer hydrogen barrier comprises at least one amorphous silicon layer formed above the ferroelectric capacitor.

25. The semiconductor device of claim 21, wherein the multilayer hydrogen barrier comprises:

an aluminum oxide layer formed over the ferroelectric capacitor; and a first silicon rich silicon oxide layer formed over the aluminum oxide layer.

26. The semiconductor device of claim 25, wherein the multilayer hydrogen barrier further comprises an amorphous silicon layer formed over the first silicon rich silicon oxide layer and a second silicon rich silicon oxide layer formed over the aluminum oxide layer.

* * * * *